(12) United States Patent
Gough et al.

(10) Patent No.: US 6,866,577 B2
(45) Date of Patent: Mar. 15, 2005

(54) MOUNTING COOLING UNITS

(75) Inventors: Gerry Gough, Houghton Regis (GB); William Hunt Vincent, Yateley (GB)

(73) Assignee: Sun Microsystems, Inc., Santa Clara, CA (US)

(*) Notice: Subject to any disclaimer, the term of this patent is extended or adjusted under 35 U.S.C. 154(b) by 179 days.

(21) Appl. No.: 10/166,521

(22) Filed: Jun. 10, 2002

(65) Prior Publication Data

US 2003/0228840 A1 Dec. 11, 2003

(51) Int. Cl.[7] .................................................. H05K 5/03
(52) U.S. Cl. ...................................... 454/184; 361/695
(58) Field of Search ............................ 454/184; 361/695

(56) References Cited

U.S. PATENT DOCUMENTS

| 5,559,673 | A |   | 9/1996  | Gagnon et al. |         |
|-----------|---|---|---------|---------------|---------|
| 6,031,719 | A | * | 2/2000  | Schmitt et al.| 361/695 |
| 6,288,898 | B1|   | 9/2001  | Johnson et al.|         |
| 6,292,361 | B1|   | 9/2001  | Johnson et al.|         |
| 6,364,761 | B1|   | 4/2002  | Steinbrecher  |         |
| 6,412,948 | B2|   | 7/2002  | Yanari        |         |
| 6,464,578 | B1| * | 10/2002 | Chin et al.   | 454/184 |
| 6,556,437 | B1| * | 4/2003  | Hardin        | 361/687 |

* cited by examiner

Primary Examiner—Gregory Wilson
(74) Attorney, Agent, or Firm—Meyertons Hood Kivlin Kowert & Goetzel, P.C.; B. Noël Kivlin

(57) ABSTRACT

There is described a mounting assembly for attaching cooling units such as fans to a housing for electrical circuitry to provide a cooling inflow of air into the housing through an opening. Detents are provided on the housing at one side of the opening, and a fixing element is located at the other side of the opening. The cooling unit is provided with abutments for engaging the detents and a fastener for engaging the fixing element, to secure the cooling unit to the housing with minimum operator time. Embodiments of the invention provide a mounting plate and a mounting assembly for use with conventional cooling units and housings.

10 Claims, 4 Drawing Sheets

US 6,866,577 B2

MOUNTING COOLING UNITS

BACKGROUND OF THE INVENTION

The present invention relates to cooling units for electronic circuitry, and particularly concerns the mounting of cooling fans to electronic circuit housings. Illustrative embodiments relate to, but not exclusively to, cooling units for use with computer systems.

Electronic circuitry, and particularly processor circuitry, is susceptible to performance deterioration if it is allowed to operate outside an ideal temperature range. In some circumstances electronic circuits can even fail due to an excess of heat. Electronic circuitry is conventionally contained in a sheet metal housing. The housing may be mountable in a larger supporting rack, to enable circuits to be connected together in modular form.

To reduce the likelihood of electronic circuitry overheating, it is possible to provide forced cooling by using cooling units. For example, a computer system can comprise electronic circuitry housed within a casing. Typically, the casing includes at least one vent or aperture that can be located on any face of the casing, but is typically in the front or the rear of the casing, adjacent to which a cooling unit, for example a fan unit, is mounted. Fans are operated to drive cooling air into the housing containing the electronic circuitry, thus displacing heated air from within the housing through the vents or apertures and into the surrounding environment.

Conventional cooling fans used in electronic equipment comprise a pair of spaced end frames, which are generally square in shape, joined by a circular-section duct in which is mounted an axial-flow fan, with its driving motor in the fan hub. The corners of the end frames are provided with mounting holes through which rivets, screws or other fasteners can be engaged to secure the fan to the equipment housing. The fan is secured with its duct in alignment with an opening in the housing, so that air moved by the fan can flow into the housing to cool the components of the circuit.

Although simple in construction, cooling fans may fail prematurely in their operating lifetime, and require to be replaced. This operation typically involves removing the fasteners which fix the fan to the equipment housing, disconnecting an electrical connection, and finally removing the faulty fan. A replacement fan is mounted by locating the fan in place and fixing it using fasteners, then connecting an electrical lead to the equipment housing. This two-stage process is time consuming for the maintenance operative, and cannot usually be entrusted to an unskilled operator.

A need therefore exists for a fan which may be rapidly and easily removed from, and located and secured to, a housing of an electronic circuit.

SUMMARY OF THE INVENTION

One aspect of the invention provides a combination of a housing for electronic circuitry and a cooling fan assembly comprising a fan and a mounting plate attached to the fan, the mounting plate having a fixing face, abutments facing away from the fixing face and a captive fastener element, the housing having a locating face engageable with the fixing face, detents engageable with the abutments to prevent separation of the fixing face and the locating face, and a fixing element cooperable with the captive fastener element to secure the mounting plate to the housing.

Another aspect provides a housing for electronic equipment to which a cooling unit is mountable for easy removal, the housing comprising a fixing face to receive the cooling unit, detents facing toward the fixing face, and a fixing element cooperable with a fastener element of the cooling unit. An alternative embodiment provides a housing having plural fixing faces, to receive a like number of cooling units.

A yet further aspect provides for a mounting plate attachable to a cooling unit, the mounting plate comprising a mounting surface, an abutment facing away from the mounting surface, and a captive fastener element. The mounting plate is rectangular in one embodiment, with the abutment and captive fastener positioned adjacent opposite edges of the plate.

A yet further aspect provides for a housing for an electronic circuit including detents for accepting abutments of a mounting plate, and a fixing element for receiving a captive fastener of a mounting plate.

A yet further aspect provides for a mounting assembly for a cooling unit, comprising a mounting plate having securing elements for attaching the mounting plate to a cooling unit and a receiving plate having securing elements for attaching the receiving plate to a housing for an electronic circuit, the mounting plate and receiving plate having a cooperable abutment and detent, respectively, and a captive fastener being provided on the mounting plate to engage a fixing element of the receiving plate. In an alternative embodiment, the receiving plate may comprise plural sets of detents and fixing elements to enable a plurality of mounting plates to be mounted to the receiving plate.

A further aspect provides a method for mounting a cooling unit to a housing for an electronic circuit.

BRIEF DESCRIPTION OF THE DRAWINGS

Embodiments of the invention will now be described in detail with reference to the accompanying drawings, in which like parts are given like reference numbers. In the Drawings.

DESCRIPTION OF PARTICULAR EMBODIMENTS

Figure 1:
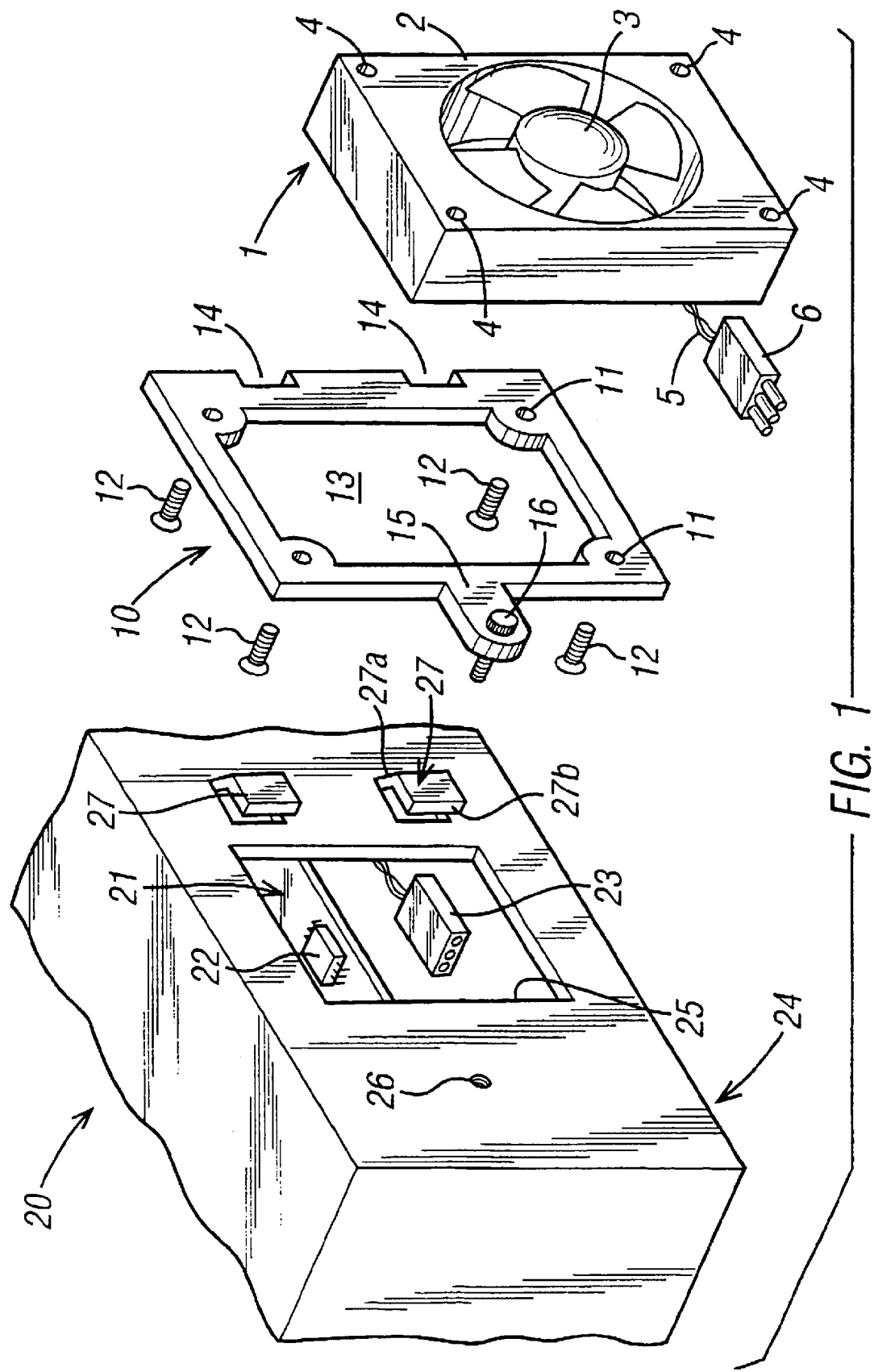
FIG. 1 is an exploded perspective view showing a first fan mounting arrangement according to the invention.

Referring now to FIG. 1, there is shown schematically a cooling fan 1 comprising a substantially square housing 2 supporting an axial-flow fan 3. Adjacent the corners of the housing 2 are through-bores 4, through which fasteners are conventionally passed to secure the fan housing 2 to its supporting structure. Extending from the fan housing are a number of cables 5 leading to a plug connector 6. The plug connector 6 and cables 5 serve to provide a power supply to the fan motor which is housed within the hub of the cooling fan 3 and may transmit control signals to the fan and/or sensing signals from the fan. A protective grille or finger guard (not shown) is conventionally provided on the exposed face of the fan 3 to prevent ingress of foreign bodies into the fan.

The fan 1 shown in FIG. 1 is of the conventional type, and is usually mounted to a supporting structure by passing fasteners through the through-bores 4. In the embodiment shown in FIG. 1, a mounting plate 10 is provided to secure the fan to an electronics cabinet 20, a part of which is shown in Figure and will be described in detail later.

The mounting plate 10 is generally rectangular, corresponding in size and shape to the housing 2 of the cooling fan 1. The mounting plate is provided with openings 11 positioned to coincide with the through bores 4 of the housing 2. Screw fasteners 12 are insertable through the openings 11 to secure the mounting plate 10 to the housing 2 of the cooling fan 3. The fasteners 12 may alternatively be rivets, bolts or expanding fasteners.

The mounting plate 10 has a large central aperture 13, which is dimensioned so as not to obstruct the passage of air flowing through the fan 3.

The mounting plate 10 is further provided with a pair of cut outs 14 on its right-hand edge (as seen in FIG. 1), and on the edge opposite to the cut outs 14 is a lug 15 through which a captive fastener 16 passes. The captive fastener 16 is a threaded fastener, but may be for example a snap-fastener or a quarter-turn fastener.

The electronics cabinet 20 seen in FIG. 1 contains one or more circuit boards 21 on which electronic components 22 are mounted. The cabinet also provides a connection socket 23 which may be on a flying lead or may be rigidly mounted on a panel or a circuit board. The socket 23 is engageable with the plug connector 6 of the cooling fan to supply power and/or signals to the fan motor.

The cabinet 20 is provided, on its rear face 24, with an aperture 25 of a similar size and shape to the central aperture 13 of the mounting plate 10. Adjacent the left hand side of the aperture 25 (as seen in FIG. 1) is a threaded hole 26 to receive threaded fastener 16, and adjacent the right-hand side of the aperture 25 are a pair of claws 27 struck from the rear face 24 of the cabinet 20. The claws comprise root portions 27a extending obliquely out of the plane of the rear face 24, and spaced engaging portions 27b extending substantially parallel to the plane of the rear face 24. The dimensions and spacing of the claws 27 correspond to the dimensions and spacing of the cut outs 14 in the mounting plate 10.

As an alternative to a single aperture 25, the rear face 24 of the cabinet 20 may be provided with a plurality of smaller openings positioned in an area between the threaded hole 26 and the claws 27.

A quickly detachable mounting for the fan to the cabinet 20 is provided by the assembly shown in FIG. 1. The mounting plate 10 is permanently attached to the housing 2 of the cooling fan 1, by means of screw fasteners 12 extending through the openings 11 and engaging the through bores 4 of the body 2 of the cooling fan 1. The cables 5 extend through the central aperture 13 of the mounting plate 10.

When the fan 1 is to be mounted to the cabinet 20, the connector socket 23 is drawn out through the aperture 25 of the cabinet 20, and the plug connector 6 is engaged with the connection socket 23. The fan 1 and mounting plate 10 are then offered up to the rear face 24 of the cabinet 20, such that the recesses 14 are aligned with the claws 27. The mounting plate is then moved to the right as seen in the Figure, so that the cut-outs 14 embrace the root portions 27a of the claws 27, and the engaging portions 27b of the claws 27 overlie the mounting plate 10. In this position, the captive fastener 16 is in alignment with the threaded opening 26, and by simply threading the captive fastener 16 into the opening 26, the mounting plate 10 and cooling fan 1 are securely fixed to the rear face 24 of the cabinet 20.

To remove the cooling fan 1 for replacement or servicing, the operative simply releases the captive fastener 16, slightly pivoting the mounting plate 10 relative to the rear face 24 about the edge of the mounting plate 10 opposite lug 15, and the claws 27 may then be disengaged from the cut outs 14. By disconnecting the plug connector 6 from the connection socket 23, the faulty cooling fan may be removed.

The replacement cooling fan, with its mounting plate 10 already attached, is then mounted to the cabinet by connecting the plug connector 6 and connection socket 23, and then offering the cooling fan and mounting plate to the cabinet such that the claws 27 of the cabinet enter the cut outs 14 of the mounting plate 10. The mounting plate 10 is then swung parallel with the rear face 24 of the cabinet 20, and captive fastener 16 is engaged with threaded opening 26 to secure the replacement fan in position.

The embodiment illustrated in FIG. 1 thus provides for the simple replacement of a cooling fan by the disengagement of a single fastener and a single electrical connector. By making the fastener 16 captive to the mounting plate 10, the risk that the operative may drop and lose the fastener 16 is eliminated.

Figure 2:
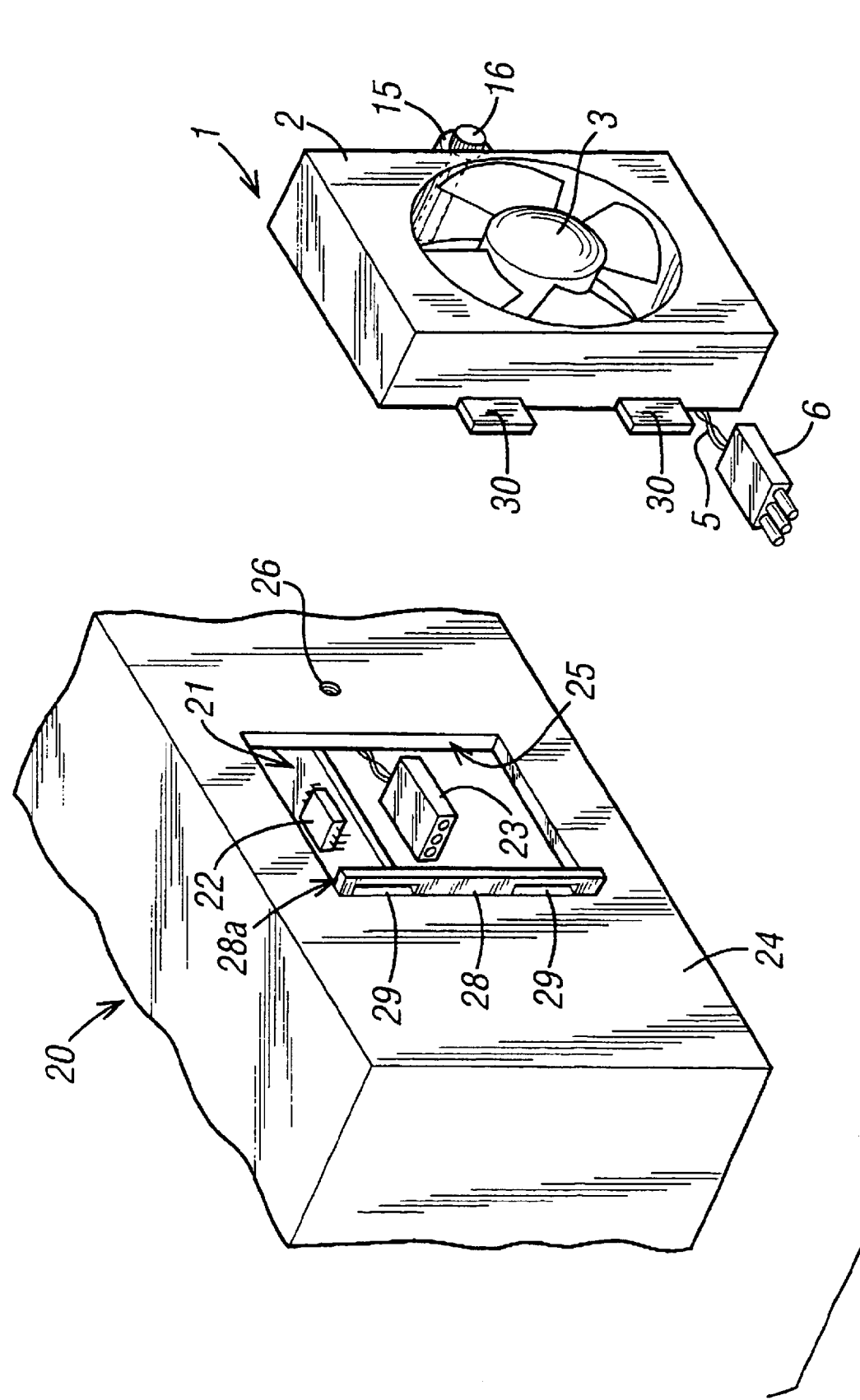
FIG. 2 is an exploded perspective view showing a second fan mounting arrangement.

An alternative embodiment of the invention is illustrated in FIG. 2, which shows an electronics cabinet 20 having a rear face 24 formed with an aperture 25. Along the left-hand edge (as seen in the Figure) of the aperture 25, an upstanding rib 28 extends out of the plane of the rear face 24. The rib 28 is formed with a pair of slots 29 extending through the rib 28. The slots 29 form undercuts which are accessible from the face 28a of the rib 28 adjacent the aperture 25. Adjacent the edge of the aperture 25 remote from the rib 28, a threaded hole 26 is provided in the rear face 24 of the cabinet.

The cooling fan 1 shown in FIG. 2 comprises a body 2 and a fan 3 as before. The body 2 of the cooling fan 1 is provided with a pair of tabs 30 extending from the left-hand edge of the fan as seen in the Figure. The tabs 30 are shaped and spaced so as to be insertable in the slots 29 of the rib 28 of the cabinet.

The side of the fan body 2 opposite the tabs 30 is provided with a lug 15, in which is secured a captive fastener 16 having a threaded shank for engagement with the threaded hole 26 of the rear face 24 of the cabinet 20.

As before, cables 5 extend from the fan body 2 and terminate in a plug connector 6 for supplying electrical power to the motor of the fan 3.

In order to mount the fan 1 to the cabinet, the plug connector 6 is first joined to the connection socket 23 of the cabinet, and the tabs 30 are then offered up to the face 28a of the rib 28 so that the tabs 30 enter the slots 29. When the tabs 30 are fully inserted into the slots 29, the captive fastener 16 is in alignment with the threaded hole 26 and can be engaged therein to fix the fan in position. A sealing gasket may be provided on the fan body 2 to form a seal around the aperture 25 so that all air flow through the fan 3 enters the cabinet 20.

Figure 3:
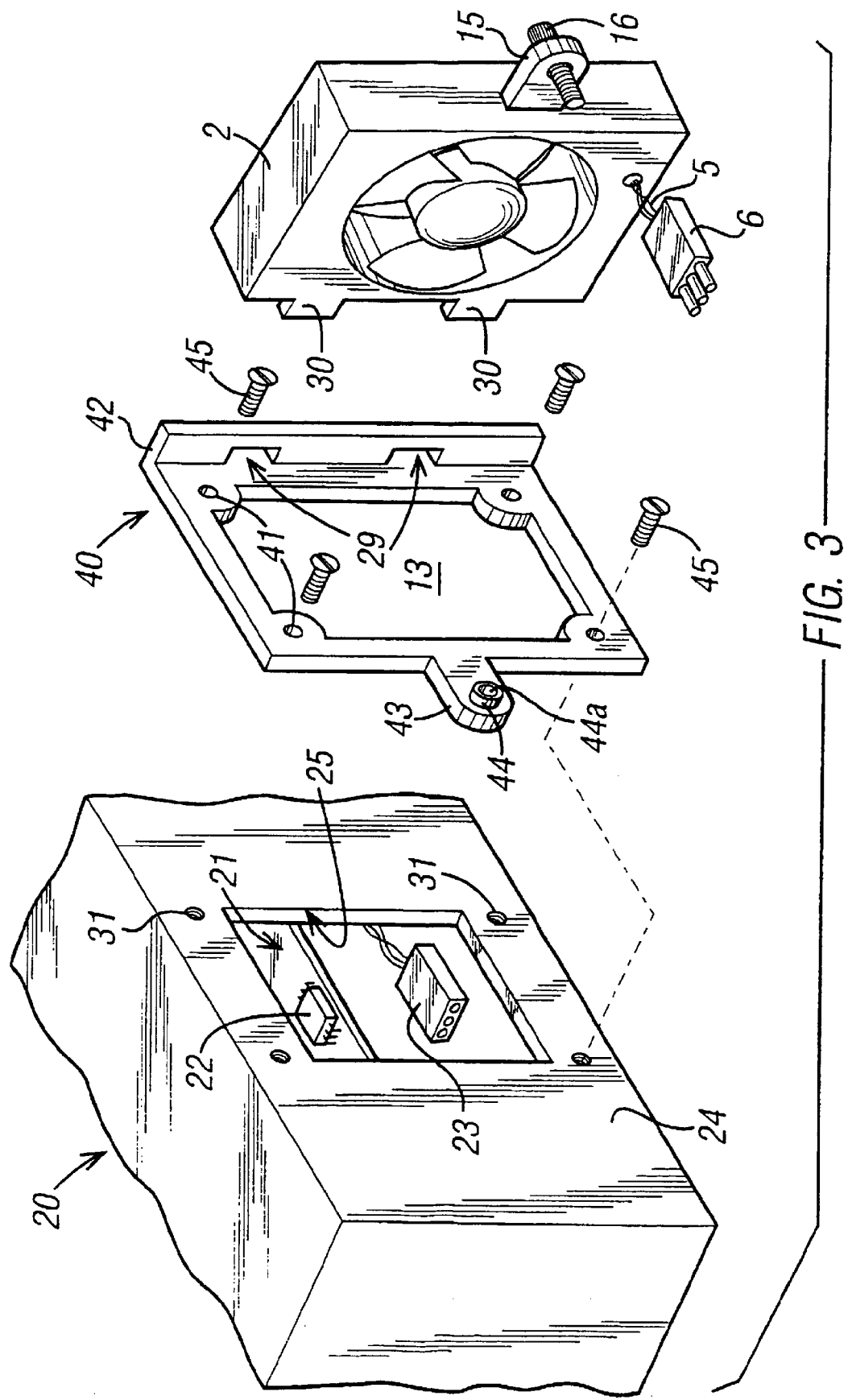
FIG. 3 is an exploded perspective view showing a third fan mounting arrangement.

Referring now to FIG. 3, there is provided an assembly enabling the modified fan shown in FIG. 2 to be mounted to a conventional electronics cabinet 20. In the conventional cabinet 20, the rear face 24 of the cabinet is provided with an aperture 25, and adjacent the corners of the aperture 25 are threaded fixing holes 31 which normally accept fasteners passing through the bores 4 of the conventional cooling fan 1 seen in FIG. 1.

The embodiment of FIG. 3 provides a mounting bracket 40 which has bores 41 positioned to correspond with the fixing holes 31 of the cabinet 20, and a central aperture 13 of a shape and size to correspond to the aperture 25 in the rear face 24 of the cabinet 20. The mounting bracket 40 further comprises an upstanding rib 42 extending along one side of the mounting bracket 40, and provided with a pair of slots 29. On the side opposite the rib 42, the mounting bracket 40 comprises a projection 43, on which is mounted a boss 44 having a threaded bore 44a.

In an alternative embodiment, the mounting bracket 40 may be provided with a plurality of sets of apertures 13, ribs 42 with slots 29, and bores 44, so that a like number of cooling units may be mounted to a single mounting bracket 40, either before or after the mounting bracket is attached to the cabinet 20.

The fan used in the assembly of FIG. 3 is substantially similar to that used in the assembly used in FIG. 2, and has a body 2 formed with a pair of tabs 30 spaced and dimensioned so as to be receivable in the slots 29 of the rib 42 of the mounting bracket 40. On its side opposite the tabs 30, the fan body 2 has a lug 15 supporting a captive threaded fastener 16. A cable 5 extends out of the body 2 and terminates in a plug connector 6.

The mounting bracket 40 enables either a single cooling unit or a plurality of cooling units to be detachably mounted to a conventional electronics cabinet. The mounting bracket 40 is offered up to the rear face 24 of the cabinet so that the holes 41 in the mounting bracket are aligned with the fixing holes 31 of the cabinet. Fixing screws 45 are then passed through the holes 41 to engage the fixing holes 31 to secure the mounting bracket 40 permanently to the cabinet 20.

The cooling fan 1 is mounted to the cabinet 20 by connecting the plug connector 6 with the connection socket 23, and then offering the fan body 2 up to the mounting bracket 40 so that the tabs 30 of the fan body 2 enter the slots 29 in the rib 42 of the mounting bracket. The captive fastener 16 is then engaged in the threaded bore 44a of the boss 44, to secure the fan body 2 in position relative to the mounting bracket 40. In illustrated embodiments, no gaskets are used. However, sealing gaskets (not shown) may be provided between the mounting bracket 40 and the rear face 24 of the cabinet 20, and/or between the mounting bracket 40 and the body 2 of the cooling fan 1 to prevent leakage of air.

Figure 4:
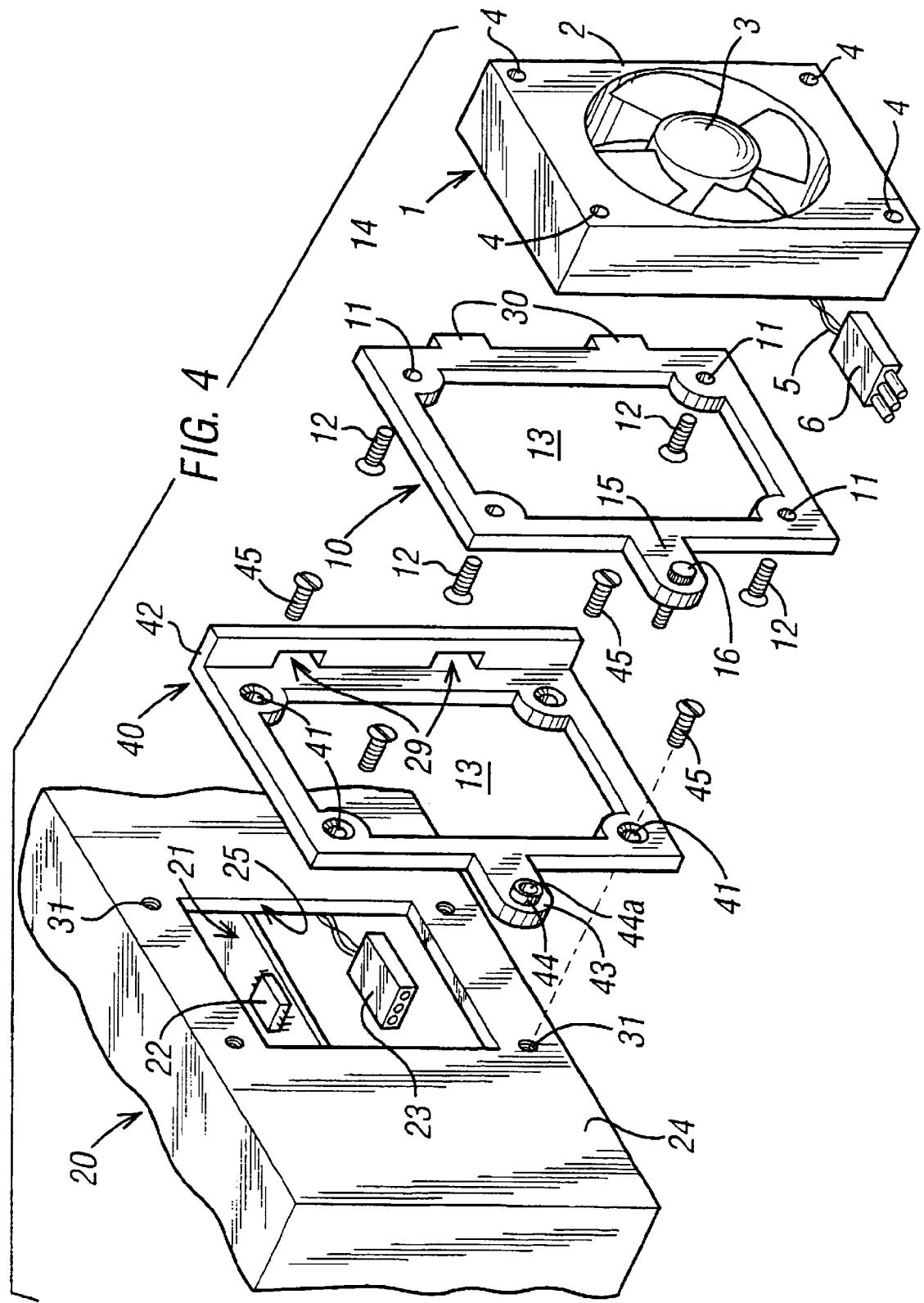
FIG. 4 is an exploded view showing a fourth embodiment of the invention.

FIG. 4 illustrates a further embodiment of the invention, and provides a mounting plate and mounting bracket assembly for securing a conventional cooling fan to a conventional cabinet in such a way that the fan may be easily detached from the cabinet for replacement or servicing.

FIG. 4 shows a cabinet 20 having a rear face 24 formed with an aperture 25, and fixing holes 31 adjacent the corners of the aperture 25. A circuit board 21 is contained within the cabinet 20, and components 22 are mounted on the circuit board 21. A connection socket 23 is provided as before within the cabinet 20.

A mounting bracket 40 similar to that shown in FIG. 3 is attachable to the rear face 24 of the cabinet 20 by means of fixing screws 45 passing through holes 41 in the mounting bracket 40 to engage the fixing holes 31 of the cabinet 20. The mounting bracket 40 is generally rectangular and has a central aperture 13 to coincide with the aperture 25 of the cabinet. Along the right-hand edge of the mounting bracket 40 (as seen in the Figure) an upstanding rib 42 is formed. A pair of slots 29 extend through the ridge 42. On its side opposite the rib 42, the mounting plate 40 is formed with a lug 43 supporting a boss 44 having a threaded bore 44a.

The assembly of FIG. 4 further comprises a mounting plate 10 similar to that shown in FIG. 1. The mounting plate 10 differs from that shown in FIG. 1 in that instead of cut-outs 14 on its right-hand edge (as shown in the Figure), the mounting plate 10 of FIG. 4 is provided with two projecting tabs 30. A lug 15 extending from the left-hand edge of the mounting plate 10 supports a captive fastener 16. The mounting plate 10 is attachable to a conventional cooling fan body 2 by means of screw fasteners 12 extending through openings 11 in the mounting plate 10 to engage through bores 4 of the body 2 of the cooling fan 1.

The cooling fan 1 is attached to the cabinet 20 by first permanently fixing the mounting bracket 40 to the cabinet 20 by means of the fixing screws 45. The mounting plate 10 is likewise permanently attached to the cooling fan 1 by screw fasteners 12 passing through openings 11 to engage the through bores 4 of the fan body 2. The cables 5 of the fan body 2 extend through the central aperture 13 of the mounting plate 10.

After the plug connector 6 has been engaged with the connector socket 23, the mounting plate 10 is offered to the mounting bracket 40 so that the tabs 30 of the mounting plate 10 enter the slots 29 of the mounting bracket 40, and the captive fastener 16 of the mounting plate 10 is then aligned with the threaded bore 44a of the boss 44 of the mounting bracket 40. Engaging the captive fastener 16 with the boss 44 fixes the fan to the housing in a readily detachable manner.

The mounting bracket 40 and mounting plate 10 may be formed from sheet metal, or may be moulded from plastics material. As an alternative to the use of fixing screws 45 and screw fasteners 12, the mounting bracket 40 may be rivetted or adhesively bonded to the cabinet 24, and the mounting plate 10 may be rivetted, bonded or welded to the fan body 2.

As an alternative to the captive fastener 16 and threaded bore 44a, a press-stud fixing or a quarter-turn fastener may be used. The bore 44 and threaded bore 44a will, in that case, be replaced by a suitable complementary fixing element.

Although in FIG. 4 the mounting plate 10 is provided with projections and the mounting bracket 40 is provided with slots 29 to receive the projections (tabs 30) of the mounting plate, it is to be understood that the mounting bracket 40 may be provided with one or more projections and the mounting plate 10 may be provided with recesses to accept those projections in order to secure the two components together.

In a further alternative embodiment, the mounting bracket 40 of FIG. 4 may be attached to the housing 20 not by means of fixing screws 45, but by providing detents on the mounting bracket 40 to engage abutments on the housing, and by providing a captive fastener on the mounting bracket to engage a fixing element in the housing. The mounting bracket 40 is thus mounted to the cabinet 20 in the same way that the mounting plate 10 is mounted to the cabinet in FIG. 1.

The mounting bracket 40 of FIG. 4 or its variant described above, may be configured with plural sets of slots 29 and bores 44, to receive a plurality of fan units on a single mounting bracket. Although in the illustrated embodiments the tabs 30 and slots 29 are shown with rectangular cross-sections, it is foreseen that the tabs 30 may be rod-like projections of circular cross-section and the slots 29 may be replaced by circular-section recesses or bores of corresponding diameter.

The illustrated embodiments show the cables 5 for the plug connector 6 passing through the apertures 13 and 25 in the mounting plates and the cabinet, respectively. It is to be understood that the cables 5 may be routed exteriorly of the fan body 2 to connect to a connection socket 23 mounted, either fixedly or by a flying lead, to the outside of the cabinet 20. To secure the cable in its intended routing position, cable clamps may be provided on the fan body 2 and/or on the mounting plate 10. If such an exterior cable routing is used, the removal and replacement of the fan body from and to the cabinet 20 may be effected after disconnection of the plug connector 6 from the connection socket 23.

The fasteners 16 shown in the illustrated embodiments are threaded fasteners with knurled heads, releaseable by an operator without the use of tools. Safety considerations may require that in such cases the fan 3 is provided with grilles at both its air entry and exit faces, since it is possible for an unskilled operator to remove the fan without tools while the power to the fan is still connected, risking the injury of the operator's fingers in the fan.

In an alternative embodiment, the fastener 16 may be replaced by a tool-operated component such as a slotted or crosshead screw, a hexagon socket screw or the like. This will prevent the fan from being removed by unskilled operatives using only their fingers, and should prevent all but authorised service personnel from removing the fans. In this situation, it is necessary only to provide a protective grille on the exposed face of the mounted fan, since the trained operative will disconnect the power before removing the fan.

In any of the illustrated embodiments the manually operated fastener 16 may be substituted by a fastener requiring the use of a tool to release it. The tool-operated fastener may also require the use of a tool to engage it.

The fixing screws 12 and 45 used to non-releasably attach plates to casings or plates to fans may likewise be substituted by any convenient fixing arrangement, such as by rivetting, bolts and nuts, welding, expanding fasteners, or adhesive bonding of the components.

The fans in the illustrated embodiment are mounted to a substantially flat face of the cabinet 20. It is foreseen however that the fan or fans may be mounted in recesses formed in the external contour of the cabinet, so that mounting the fan does not add to the exterior dimensions of the cabinet 20. By avoiding if possible the use of sealing gaskets between the fan the mounting plates, and the cabinet 20, the compactness of the assembly is assured.

In the described embodiments, the fans are mounted to a rear face 24 of the cabinet 20. It is to be understood that the fan may be mounted to any convenient face of the cabinet, such as the front face in particular. Furthermore, embodiments are possible wherein the detent is situated on one face of the cabinet and the fixing element is situated on an adjacent face of the cabinet, with the opening formed between the detent and the fixing element in either or both of the one face and the adjacent face.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims may be formulated to such features during the prosecution of this application or of any further application derived herefrom. In particular, with reference to the appended claims, features from dependent claims can be combined with those of the independent claims and features from respective independent claims can be combined in any appropriate manner and not merely in the specific combinations enumerated in the claims.

What is claimed is:

1. A combination of a housing for an electrical circuit and a cooling unit detachably mountable to the housing, the housing comprising:

an enclosure defining an interior space for receiving electrical circuit components;

a receiving surface for receiving the cooling unit;

an opening in the receiving surface;

at least one detent having an engagement surface facing toward the interior of the enclosure and positioned adjacent a first edge of the opening; and a fixing element positioned adjacent an edge of the opening opposite said first edge;

and the cooling unit comprising:

a mounting surface engageable with the receiving surface;

an air duct and a ventilator operable to cause an air flow through the duct;

at least one abutment surface positioned at one side of the mounting surface and facing oppositely to the mounting surface; and a fastener positioned at a side of the mounting surface opposite to said one side;

the arrangement being such that the abutment surfaces of the cooling unit are engageable by the detents of the housing, and the air duct of the cooling unit is aligned with the opening in the housing when the mounting surface of the cooling unit abuts the receiving surface of the housing and the fastener of the cooling unit is aligned with and engageable with the fixing element of the housing.

2. A combination according to claim 1 wherein the fastener of the cooling unit is a captive threaded fastener and the fixing element of the housing is a threaded bore.

3. A combination according to claim 1, wherein the abutment surfaces of the cooling unit are provided on projections extending from a body of the cooling unit.

4. A combination according to claim 1, wherein the abutment surfaces of the cooling unit are provided in recesses in the cooling unit.

5. A combination according to claim 1 wherein the detents of the housing are formed by the cantilever projections extending parallel to and spaced from the receiving surface.

6. A combination according to claim 1, wherein the detents of the housing are constituted by bores or slots formed in a rib extending substantially perpendicularly to the receiving surface.

7. A combination according to claim 1, wherein the cooling unit comprises an axial-flow fan in said air duct.

8. A mounting assembly for detachably mounting a cooling unit to a housing for an electrical circuit, wherein the cooling unit has a mounting face, an air duct opening on to the mounting face and holes to accept fasteners, and the housing has a face with an air opening for admitting cooling air into the housing and fixing holes to receive fasteners, the mounting assembly comprising a mounting plate and a receiving plate, the mounting plate comprising:
  a first face engageable with the mounting face of the cooling unit and having a central aperture alignable with the air duct;
  a second face engageable with the receiving plate;
  a least one abutment surface facing away from the second face at a first edge of the mounting plate; and
  a fastener positioned at an edge of the mounting plate opposite said first edge;

and the receiving plate comprising:
  a first face engageable with the housing and having a central aperture to surround the air opening;
  a second face engageable with the mounting plate;
  at least one detent adjacent one edge of the receiving plate facing towards said second face; and
  a fixing element adjacent an edge of the receiving plate opposite said first edge the arrangement being such that the mounting plate is retainable to the receiving plate at their respective first edges by the interengagement of the abutment surface and the detent, and the mounting plate is fixable to the receiving plate at their respective edges opposite said first edges by the engagement of the fastener and the fixing element.

9. A mounting assembly according to claim 8, wherein the receiving plate is mountable to the housing at one side of the receiving plate by the interengagement of at least one detent of the receiving plate with an abutment surface of the housing, and at a side of the receiving plate opposite said one side by a fastener of the receiving plate engaging a fixing element of the housing.

10. A mounting assembly according to claim 9, wherein the receiving plate is adapted to receive a plurality of mounting plates.

* * * * *